(12) United States Patent
Wang et al.

(10) Patent No.: US 12,451,362 B2
(45) Date of Patent: Oct. 21, 2025

(54) METHOD FOR FABRICATING SEMICONDUCTOR STRUCTURE, AND SEMICONDUCTOR STRUCTURE

(71) Applicants: CHANGXIN MEMORY TECHNOLOGIES, INC., Hefei (CN); Beijing Superstring Academy of Memory Technology, Beijing (CN)

(72) Inventors: Xiaoguang Wang, Hefei (CN); Huihui Li, Hefei (CN); Qiang Zhang, Hefei (CN); Shan Wang, Hefei (CN); Minmin Wu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 756 days.

(21) Appl. No.: 17/826,177

(22) Filed: May 27, 2022

(65) Prior Publication Data

US 2023/0170224 A1    Jun. 1, 2023

Related U.S. Application Data (63) Continuation of application No. PCT/CN2022/077793, filed on Feb. 25, 2022.

(30) Foreign Application Priority Data

Nov. 30, 2021    (CN) .................. 202111449848.9

(51) Int. Cl.
   *H01L 21/308*    (2006.01)
   *H01L 21/033*    (2006.01)
   *H10B 12/00*    (2023.01)

(52) U.S. Cl.
   CPC ...... *H01L 21/3086* (2013.01); *H01L 21/0337* (2013.01); *H10B 12/09* (2023.02); *H01L 21/3081* (2013.01)

(58) Field of Classification Search
   CPC ............. H01L 21/3086; H01L 21/0337; H01L 21/3081; H01L 21/0334; H01L 21/3083; H10B 12/09
   See application file for complete search history.

(56) References Cited

U.S. PATENT DOCUMENTS

| | | | |
|---|---|---|---|
| 7,115,525 B2 * | 10/2006 | Abatchev | H01L 21/0332 438/689 |
| 8,142,986 B2 * | 3/2012 | Sim | H01L 21/0337 430/313 |

(Continued)

FOREIGN PATENT DOCUMENTS

| | | |
|---|---|---|
| CN | 101512726 B | 11/2011 |
| CN | 104716160 A | 6/2015 |

(Continued)

OTHER PUBLICATIONS

United States Patent and Trademark Office, Final office action issued in related U.S. Appl. No. 17/853,877 on Feb. 29, 2024.

(Continued)

*Primary Examiner* — Duy Vu N Deo
*Assistant Examiner* — Christopher Remavege
(74) *Attorney, Agent, or Firm* — Kilpatrick Townsend & Stockton LLP (57) ABSTRACT

Embodiments relate to the field of semiconductor manufacturing technology, and more particularly, to a method for fabricating a semiconductor structure and a semiconductor structure. The method for fabricating a semiconductor structure provided by the embodiments of the present disclosure includes: providing a substrate including an array region and a peripheral region; forming a first mask layer covering the (Continued)

array region and the peripheral region on the substrate; forming a first device structure pattern on the first mask layer, and then forming a second device structure pattern on the first mask layer; and etching the substrate by using the first device structure pattern and the second device structure pattern as mask layer to form a peripheral region structure and an array region structure synchronously on the substrate. Technological processes are simplified, fabrication difficulties are reduced, and production efficiency is improved.

15 Claims, 8 Drawing Sheets

(56) References Cited

U.S. PATENT DOCUMENTS

| | | | |
|---|---|---|---|
| 8,546,202 B2* | 10/2013 | Tung | H10D 84/0158 |
| | | | 438/301 |
| 9,209,038 B2* | 12/2015 | Cantone | H10D 84/038 |
| 9,324,570 B1* | 4/2016 | Liou | H01L 21/0338 |
| 9,916,978 B2* | 3/2018 | Hsu | H10D 64/021 |
| 10,224,213 B2* | 3/2019 | Byun | H01L 21/0337 |
| 10,312,090 B2* | 6/2019 | Chang | H01L 21/0337 |
| 2005/0056888 A1 | 3/2005 | Youn et al. | |
| 2006/0292497 A1* | 12/2006 | Kim | H01L 21/3086 |
| | | | 430/311 |
| 2007/0202705 A1* | 8/2007 | Kim | H01L 21/32137 |
| | | | 257/E21.309 |
| 2008/0070165 A1* | 3/2008 | Fischer | H01L 21/0338 |
| | | | 257/E21.236 |
| 2009/0035902 A1* | 2/2009 | Xu | H10D 84/038 |
| | | | 257/E21.409 |
| 2011/0017971 A1 | 1/2011 | Kim et al. | |
| 2013/0001750 A1* | 1/2013 | Arnold | H01L 21/3088 |
| | | | 257/E21.25 |
| 2013/0043525 A1 | 2/2013 | Yu et al. | |
| 2013/0161700 A1* | 6/2013 | Durga | H10D 64/015 |
| | | | 257/E27.105 |
| 2013/0337652 A1* | 12/2013 | Sun | H01L 21/0337 |
| | | | 257/E21.257 |
| 2015/0243519 A1* | 8/2015 | deVilliers | H01L 21/31111 |
| | | | 438/692 |
| 2016/0181100 A1* | 6/2016 | deVilliers | H01L 21/0337 |
| | | | 438/702 |
| 2016/0314983 A1* | 10/2016 | Han | H10D 84/038 |
| 2017/0077103 A1* | 3/2017 | Park | H10D 1/716 |
| 2018/0158526 A1* | 6/2018 | Kim | H10D 89/10 |
| 2018/0374899 A1 | 12/2018 | Yoshida et al. | |
| 2019/0035631 A1* | 1/2019 | Chang | H01L 21/0337 |
| 2019/0181014 A1* | 6/2019 | Chang | H01L 21/0337 |
| 2019/0341252 A1* | 11/2019 | Feng | H01L 21/0337 |
| 2019/0378717 A1* | 12/2019 | Sung | H01L 21/0335 |
| 2020/0321521 A1 | 10/2020 | Hsu et al. | |
| 2022/0059349 A1 | 2/2022 | Kuo et al. | |
| 2023/0068802 A1 | 3/2023 | Wang et al. | |
| 2023/0078443 A1 | 3/2023 | Wu et al. | |

FOREIGN PATENT DOCUMENTS

| | | |
|---|---|---|
| CN | 104752359 A | 7/2015 |
| CN | 105826268 A | 8/2016 |
| CN | 106024790 A | 10/2016 |
| CN | 108133936 A | 6/2018 |
| CN | 108598081 A | 9/2018 |
| CN | 109285831 A | 1/2019 |
| CN | 109285857 A | 1/2019 |
| CN | 109559978 A | 4/2019 |
| CN | 110534517 A | 12/2019 |
| CN | 113097143 A | 7/2021 |
| CN | 113707614 A | 11/2021 |

OTHER PUBLICATIONS

United States Patent and Trademark Office, Non-Final office action issued in related U.S. Appl. No. 17/853,877 on Aug. 29, 2023.
Non-final office action issued in corresponding U.S. Appl. No. 17/847,186 mailed on Jun. 2, 2025, 12 pages.

* cited by examiner

METHOD FOR FABRICATING SEMICONDUCTOR STRUCTURE, AND SEMICONDUCTOR STRUCTURE

CROSS-REFERENCE TO RELATED APPLICATION

This application is a continuation of PCT/CN2022/077793, filed on Feb. 25, 2022, which claims priority to Chinese Patent Application No. 2021114498489 titled "METHOD FOR FABRICATING SEMICONDUCTOR STRUCTURE, AND SEMICONDUCTOR STRUCTURE" and filed to the State Intellectual Property Office on Nov. 30, 2021, the entire contents of which are incorporated herein by reference.

TECHNICAL FIELD

Embodiments of the present disclosure relate to the field of semiconductor manufacturing technology, and more particularly, to a method for fabricating a semiconductor structure, and a semiconductor structure.

BACKGROUND

A semiconductor structure (such as a memory) includes a substrate and a device layer arranged on the substrate. Furthermore, the semiconductor structure also includes a peripheral region and an array region adjacent to the peripheral region. Corresponding device layers in the array region and the peripheral region are provided with corresponding Metal Oxide Semiconductor Field Effect Transistors (MOS transistors); and the substrate in the array region and the substrate in the peripheral region have mating structures configured to mate with the corresponding device layers. During fabrication, the mating structures in the array region and the peripheral region are fabricated separately, and then the device layers are formed to complete the fabrication of the semiconductor structure.

However, in related technologies, the mating structures on the substrate of the array region and the substrate of the peripheral region need to be fabricated separately, resulting in lower production efficiency.

SUMMARY

According to some embodiments, a first aspect of the present disclosure provides a method for fabricating a semiconductor structure, including:
providing a substrate including an array region and a peripheral region; forming a first mask layer covering the array region and the peripheral region on the substrate; forming a first mask pattern on the first mask layer; forming a first dielectric layer on the first mask layer and the first mask pattern; forming a second mask layer on the first dielectric layer of the array region; forming a second mask pattern on the peripheral region; forming a first device structure pattern on the first mask layer by using the second mask pattern as a mask; forming a third mask layer on the first dielectric layer of the peripheral region; forming a third mask pattern on the array region; forming a second device structure pattern on the first mask layer by using the third mask pattern as a mask; and etching the substrate by using the first device structure pattern and the second device structure pattern as mask layer to form a peripheral region structure and an array region structure, respectively.

In some disclosed embodiments, the first mask layer includes an eleventh mask layer.

The eleventh mask layer on the peripheral region is etched by using the second mask pattern as the mask to form the first device structure pattern.

The eleventh mask layer on the array region is etched by using the third mask pattern as the mask to form the second device structure pattern.

In some disclosed embodiments, the forming a third mask pattern on the array region includes:
removing a part of the second mask layer and the first dielectric layer positioned on a sidewall of the first mask pattern on the array region to form the third mask pattern.

In some disclosed embodiments, the second mask layer includes a twenty-first mask layer and a twenty-second mask layer, where the twenty-first mask layer covers a top surface and a sidewall of the first dielectric layer, and the twenty-second mask layer is positioned above the twenty-first mask layer.

In some disclosed embodiments, the twenty-second mask layer on the array region, the twenty-first mask layer on a top of the first mask pattern and the first dielectric are removed; and
the first dielectric layer positioned on the sidewall of the first mask pattern on the array region is removed to form the third mask pattern.

In some disclosed embodiments, after forming a first mask pattern on the first mask layer, the method also includes:
forming an initial twenty-first mask layer on the first mask pattern, forming a twenty-second mask layer on the initial twenty-first mask layer of the array region, and removing the initial twenty-first mask layer on the peripheral region to form the twenty-first mask layer.

In some disclosed embodiments, the forming a second mask pattern on the peripheral region includes:
removing the first mask pattern and a part of the first dielectric layer on the peripheral region, and retaining the first dielectric layer positioned on a sidewall of the first mask pattern to form a second mask pattern.

In some disclosed embodiments, a pattern density of the first device structure pattern is smaller than a pattern density of the second device structure pattern.

In some disclosed embodiments, a pattern density of the first mask pattern on the array region is the same as a pattern density of the first mask pattern on the peripheral region.

In some disclosed embodiments, the first mask pattern includes an elongated pattern.

In some disclosed embodiments, the forming a first dielectric layer on the first mask layer and the first mask pattern includes,
covering, by the first mask pattern, a part of surface of the first mask layer; and
conformally covering, by the first dielectric layer, a top surface and a sidewall of the first mask pattern and an exposed surface of the first mask layer.

In some disclosed embodiments, the first mask layer includes a twelfth mask layer positioned between the eleventh mask layer and the substrate. Before etching the substrate by using the first device structure pattern and the second device structure pattern as mask layer, the twelfth mask layer is etched by using the first device structure pattern and the second device structure pattern as the masks.

In some disclosed embodiments, the third mask layer is removed after forming the second device structure pattern.

In some disclosed embodiments, the first mask layer includes any combination of one or more of silicon oxide, dielectric anti-reflective coating, silicon oxynitride, amorphous carbon, and silicon nitride.

According to some embodiments, a second aspect of the present disclosure provides a semiconductor structure, including the semiconductor structure formed by any one of the above-mentioned methods for fabricating a semiconductor structure.

The method for fabricating a semiconductor structure and the semiconductor structure provided by the embodiments of the present disclosure include: providing a substrate including an array region and a peripheral region; forming a first mask layer covering the array region and the peripheral region on the substrate; forming a first mask pattern on the first mask layer; forming a first dielectric layer on the first mask layer and the first mask pattern; forming a second mask layer on the first dielectric layer of the array region; forming a second mask pattern on the peripheral region; forming a first device structure pattern on the first mask layer by using the second mask pattern as a mask; forming a third mask layer on the first dielectric layer of the peripheral region; forming a third mask pattern on the array region; forming a second device structure pattern on the first mask layer by using the third mask pattern as a mask; and etching the substrate by using the first device structure pattern and the second device structure pattern as mask layer to form a peripheral region structure and an array region structure, respectively. According to the method for fabricating a semiconductor structure provided by the embodiments of the present disclosure, a first device structure pattern is first formed on the first mask layer, then a second device structure pattern is formed on the first mask layer, and then the substrate is etched by using the first device structure pattern and the second device structure pattern as mask layer to form the peripheral region structure and the array region structure synchronously on the substrate. In this way, device collapse is prevented, technological processes are simplified, fabrication difficulties are reduced, and production efficiency is improved.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Several implementation manners of the present disclosure are introduced below in conjunction with the accompanying drawings. Those skilled in the art should understand that the following implementation manners are only illustrative, and are not exhaustive enumerations. On the basis of these implementation manners, those skilled in the art may replace, concatenate or combine some features or some examples, which should still be regarded as disclosed contents of the present disclosure.

Figure 1:
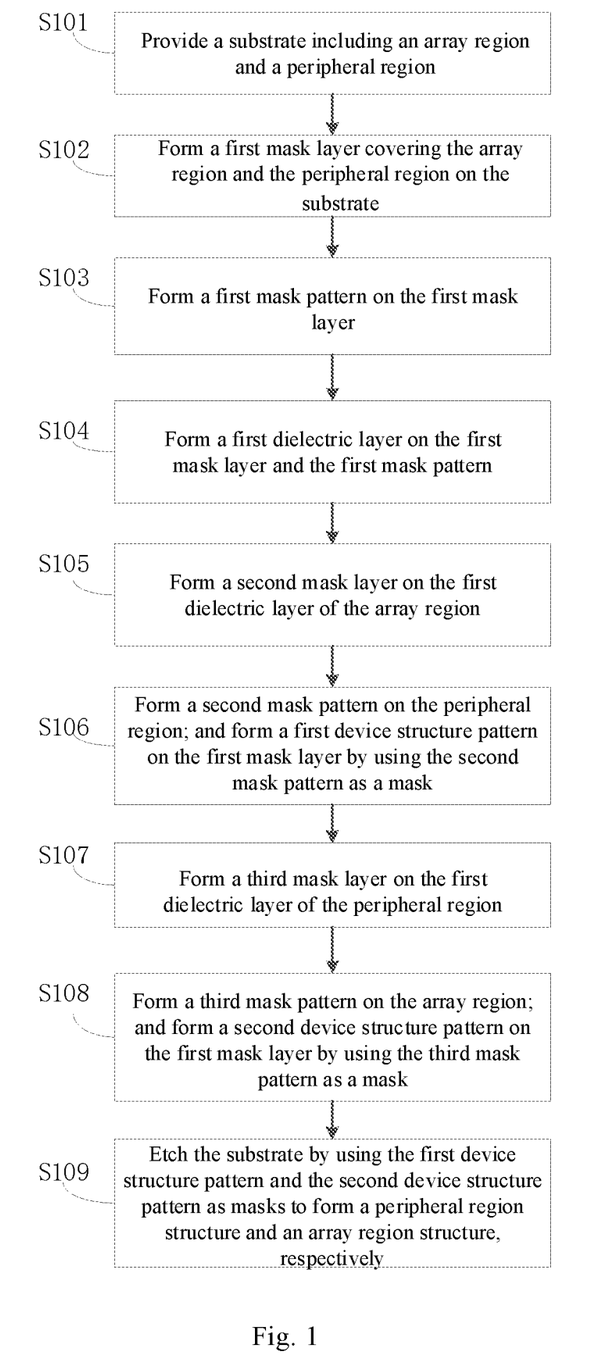
FIG. 1 is a flowchart showing steps of a method for fabricating a semiconductor structure according to an embodiment of the present disclosure.
Figure 2:
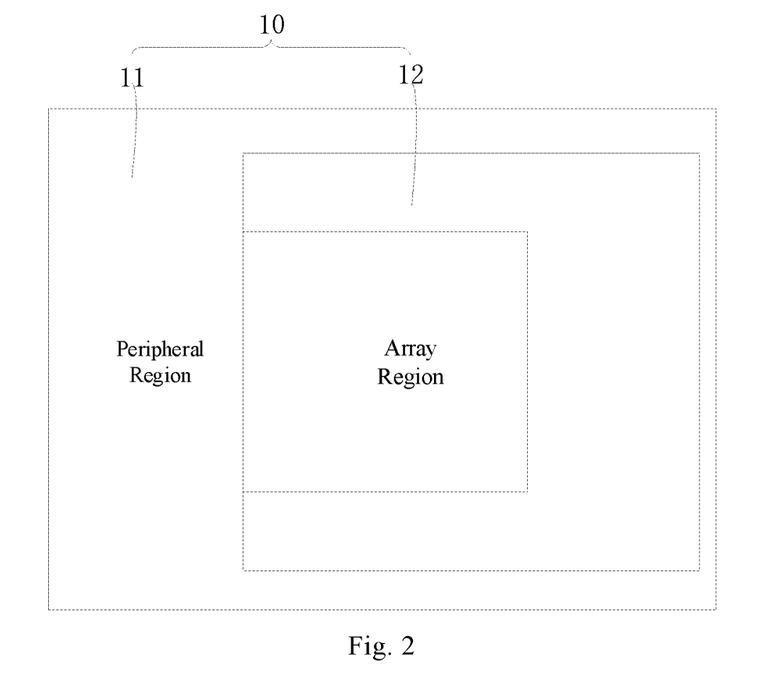
FIG. 2 is a vertical view of a substrate provided in the method for fabricating a semiconductor structure according to an embodiment of the present disclosure.

Referring to FIG. 1 and FIG. 2, an embodiment of the present disclosure provides a method for fabricating a semiconductor structure. The semiconductor structure generally includes a substrate 10 and a device layer arranged on the substrate 10. This method is used for forming, on the substrate 10, a mating structure configured to mate with the device layer, where a peripheral region structure 111 and an array region structure 121 of the substrate 10 can be formed synchronously, so technological processes are simplified, and production efficiency is improved. The method for fabricating a semiconductor structure provided by the embodiment of the present disclosure includes following steps.

Step S101: providing a substrate, where the substrate includes an array region and a peripheral region.

Figure 3:
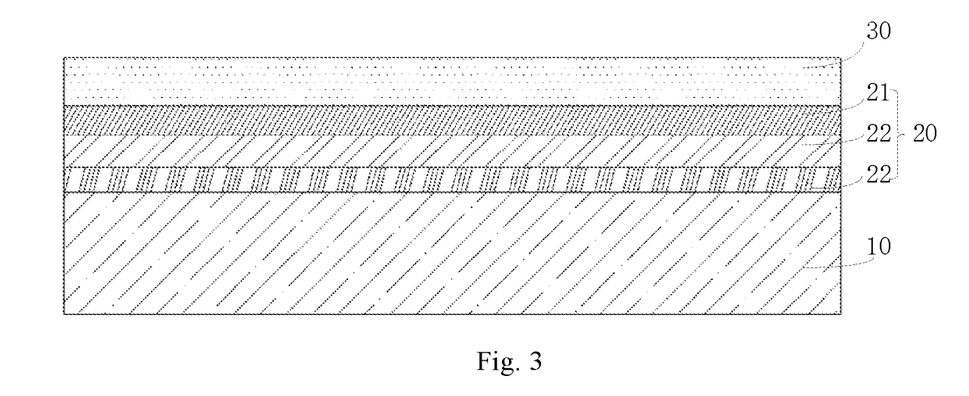
FIG. 3 is a schematic structural diagram of the substrate provided in the method for fabricating a semiconductor structure according to an embodiment of the present disclosure.

As shown in FIG. 2 and FIG. 3, the substrate 10 also includes a peripheral region 11 (a left side of a position as shown in FIG. 3) and an array region 12 (a right side of the position as shown in FIG. 3), and the array region 12 is adjacent to the peripheral region 11. Referring to FIG. 2, the peripheral region 11 may be arranged at the periphery of the array region 12. Of course, in some other examples, relative positions of the peripheral region 11 and the array region 12 may also be set according to actual needs, which is not restricted in this embodiment. The peripheral region 11 may be configured to, for example, form a mating structure configured to mate with a peripheral circuit, and the array region 12 may be configured to, for example, form a mating structure configured to mate with a memory cell. The array region 12 may also include different regions to mate with different types of memory cells. Of course, in some other examples, the mating structures of the peripheral region 11 and the array region 12 may also be configured to mate with other devices.

In this embodiment, the substrate 10 may be a semiconductor substrate 10 such as single-crystal silicon, polysilicon, or amorphous structure such as silicon or silicon germanium (SiGe), or may be a hybrid semiconductor structure, such as silicon carbide, indium antimonide, lead telluride, indium arsenide, indium phosphide, gallium arsenide or gallium antimonide, an alloy semiconductor, or a combination thereof. However, in this embodiment, types of the substrate 10 are not limited thereto.

Step S102: forming a first mask layer covering the array region and the peripheral region on the substrate.

In this embodiment, after a first mask layer 20 is formed, a part of the first mask layer 20 may be removed by means of etching, and then a first device structure pattern 211 and a second device structure pattern 212 are formed on the first mask layer 20. The first device structure pattern 211 directly faces the peripheral region 11, which is advantageous to forming a peripheral region structure 111 subsequently by using the first device structure pattern 211 as a mask. The second device structure pattern 212 directly faces the array region 12, which is advantageous to forming an array region structure 121 by using the second device structure pattern 212 as a mask.

As shown in FIG. 3, the first mask layer 20 includes a No. 11 mask layer 21 and a No. 12 mask layer 22, where the No. 11 mask layer 21 is positioned above the No. 12 mask layer 22. A material of the No. 11 mask layer 21 may include an inorganic material, for example, a dielectric anti-reflective coating (DARC) such as silicon oxide (Sift), silicon (Si), and silicon-rich silicon oxynitride (SiON). For forming patterns with pitches close to resolution limit of photolithography, light reflection is minimized by providing the No. 11 mask layer 21 to enhance resolution, thereby increasing precision of photoengraving an edge of a definable pattern, such that precision of forming mask patterns on the No. 11 mask layer 21 can be improved.

With continued reference to FIG. 3, the No. 12 mask layer 22 is positioned between the No. 11 mask layer 21 and the substrate 10. The twelfth mask layer 22 may include a plurality of film layer structures. As shown in FIG. 3, in this embodiment, the twelfth mask layer 22 may include two film layer structures. A material of the film layer structure may be amorphous carbon, which is a material highly transparent to light (i.e., "transparent carbon"), and which provides improvement of alignment by being transparent to a wavelength of light for optical alignment. Further, the amorphous carbon has very high etching selectivity relative to a hard mask material used in the related technologies, which can further improve accuracy of forming a mask pattern on the twelfth mask layer 22. The material of the film layer structures may also include silicon nitride, silicon oxide, and silicon oxynitride, etc. When a photoengraving pattern is formed on the eleventh mask layer 21, providing the twelfth mask layer 22 can protect the substrate 10.

In this embodiment, after the first mask layer 20 covering the array region 12 and the peripheral region 11 is formed on the substrate 10, the method also includes:

Step S103: forming a first mask pattern on the first mask layer.

Figure 4:
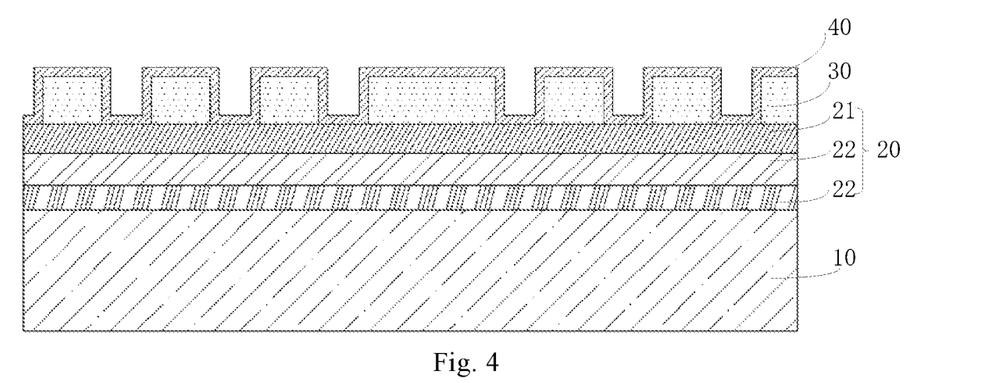
FIG. 4 is a schematic structural diagram showing a first mask pattern and a first dielectric layer formed in the method for fabricating a semiconductor structure according to an embodiment of the present disclosure.

As shown in FIG. 3 and FIG. 4, a projection of the first mask pattern 30 on the substrate 10 is positioned in the array region 12 and the peripheral region 11, such that the corresponding mating structures are respectively formed in the array region 12 and the peripheral region 11 of the substrate 10 subsequently by means of the first mask pattern 30.

In some embodiments, a pattern density of the first mask pattern 30 on the array region 12 is the same as a pattern density of the first mask pattern 30 on the peripheral region 11. The pattern density of the first mask pattern 30 on the array region 12 is the same as the pattern density of the first mask pattern 30 on the peripheral region 11, which simplifies technological processes of forming the first mask pattern 30 and improves production efficiency.

Further, the first mask pattern 30 includes an elongated pattern. Referring to FIG. 4, the first mask pattern 30 includes a plurality of elongated patterns arranged at intervals. In this embodiment, the elongated patterns may be rectangular, for example. It should be noted that in some disclosed embodiments, the peripheral region structure 111 and the array region structure 121 formed correspondingly by means of the first mask pattern 30 having the plurality of elongated patterns are also elongated. The peripheral region structure 111 and the array region structure 121 may be configured to form a part (e.g., a fin) of a Fin Field-Effect Transistor (FinFET), to improve performance of the semiconductor structure.

In a concrete implementation manner, a material of the first mask pattern 30 may include a hard mask material. A formation process of the first mask pattern 30 may include: forming a hard mask material layer on the first mask layer 20, and then etching the hard mask material layer to remove a part of the hard mask material, to form the corresponding first mask pattern 30. The hard mask material layer may be, for example, Spin on Hardmasks (SOH). As an auxiliary material for forming semiconductor fine patterns, the SOH is used as a membrane under a photoresist, and is used for facilitating a circuit to be transcribed to a target membrane to improve accuracy of the fine patterns and play an appropriate role of a defense film in the subsequent etching process. It should be noted that the material of the SOH is advantageous to achieving graphic accuracy of fine line width, thereby further improving the graphic accuracy of the first mask pattern 30.

In this embodiment, after the first mask pattern 30 is formed on the first mask layer 20, the method also includes:

Step S104: forming a first dielectric layer on the first mask layer and the first mask pattern.

As shown in FIG. 4, the first mask pattern 30 may cover a part of surface of the first mask layer 20. In the embodiment where the first mask pattern 30 includes a plurality of rectangular blocks arranged at intervals, the first mask layer 20 is exposed between adjacent two of the plurality of rectangular blocks. That is, the first mask pattern 30 may cover a part of surface of the first mask layer 20.

The forming a first dielectric layer 40 on the first mask layer 20 and the first mask pattern 30 also includes: conformally covering, by the first dielectric layer 40, a top surface and a sidewall of the first mask pattern 30 and the exposed surface of the first mask layer 20. With continued reference to FIG. 4, in this embodiment, the first dielectric layer 40 covers a sidewall of a given one of the plurality of rectangular blocks and an end surface (that is, the top surface of the first mask pattern 30) of the given rectangular block facing away from the substrate 10. The first dielectric layer 40 also covers the first mask layer 20 between adjacent two of the plurality of rectangular blocks (i.e., covering the exposed surface of the first mask layer 20).

In a concrete implementation manner, a material of the first dielectric layer 40 may include silicon oxide, silicon nitride, and silicon oxynitride, etc., such that the first dielectric layer 40 can protect the first mask pattern 30.

Step S105: forming a second mask layer on the first dielectric layer of the array region.

Figure 5:
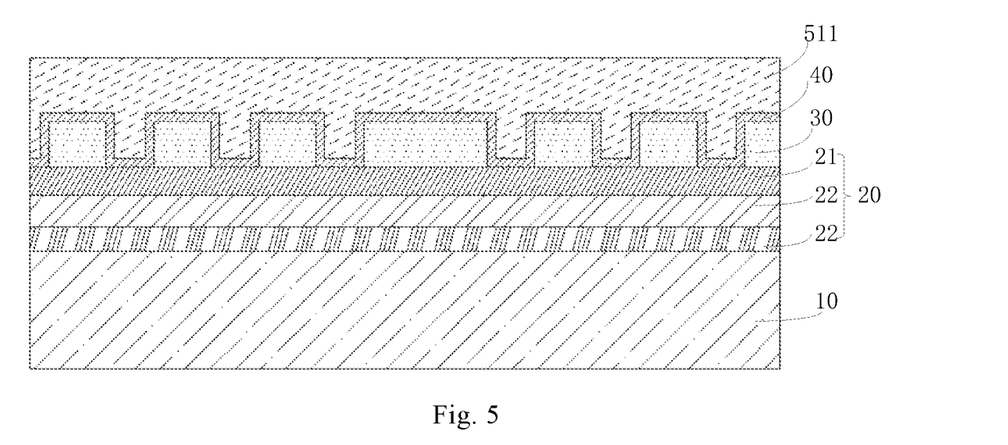
FIG. 5 is a schematic structural diagram showing a twenty-first mask layer formed in the method for fabricating a semiconductor structure according to an embodiment of the present disclosure.
Figure 6:
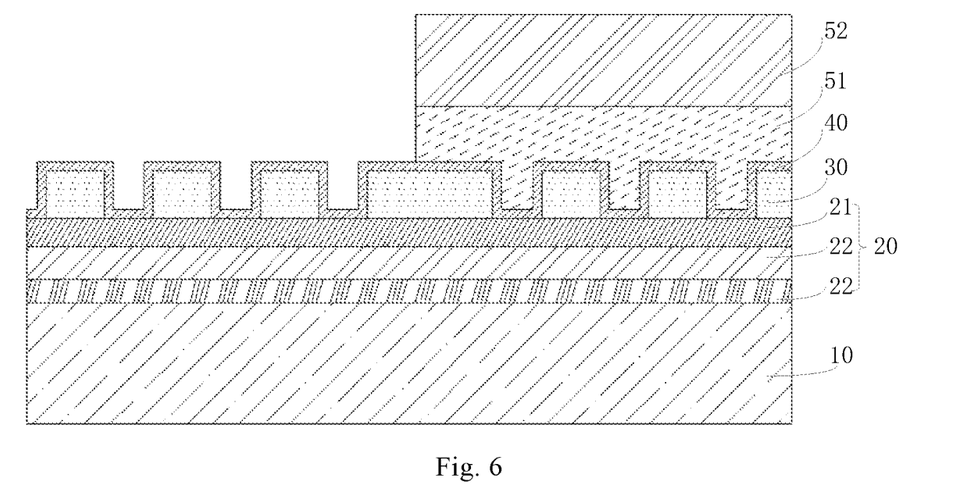
FIG. 6 is a schematic structural diagram showing a twenty-second mask layer formed in the method for fabricating a semiconductor structure according to an embodiment of the present disclosure.

As shown in FIG. 5 and FIG. 6, the second mask layer includes a twenty-first mask layer 51 covering the first dielectric layer 40 and a twenty-second mask layer 52 covering the twenty-first mask layer 51.

In this embodiment, the forming a second mask layer on the first dielectric layer 40 of the array region 12 includes: forming an initial twenty-first mask layer 51 on the first mask pattern 30; forming the twenty-second mask layer 52 on the initial twenty-first mask layer 51 of the array region 12, and removing the initial twenty-first mask layer 51 in the peripheral region 11 to form the twenty-first mask layer 51.

As shown in FIG. 5, a projection of the initial twenty-first mask layer 51 on the substrate 10 is positioned in the array region 12 and the peripheral region 11. As shown in FIG. 6, the twenty-second mask layer 52 is positioned on the twenty-first mask layer 51. A projection of the twenty-second mask layer 52 on the substrate 10 is positioned in the array region 12, and the initial twenty-first mask layer 51 is etched by means of the twenty-second mask layer 52. During the etching process, the twenty-second mask layer 52 can prevent the twenty-first mask layer 51 whose projection is positioned in the array region 12 from being etched, and the twenty-first mask layer 51 whose projection is in the peripheral region 11 is synchronously removed, thereby forming the twenty-first mask layer 51. The projection of the twenty-first mask layer 51 on the substrate 10 is positioned in the array region 12.

In this embodiment, a sidewall of the first dielectric layer 40 is positioned on a surface of the first dielectric layer 40 covering the sidewall of the first mask pattern 30, and a top surface of the first dielectric layer 40 is positioned on the surface of the first dielectric layer 40 covering the top surface of the first mask layer 20. As shown in FIG. 6, the twenty-first mask layer 51 may cover the top surface and the sidewall of the first dielectric layer 40. Further, the sidewall of the first dielectric layer 40 and the first dielectric layer 40 covering the first mask layer 20 may surround and form a groove, and the twenty-first mask layer 51 also fills up the groove.

In a concrete implementation manner, a material of the twenty-first mask layer 51 may include a hard mask material, such as SOH. It should be noted that a material of the SOH may have characteristics of filling gaps, increasing flatness and enhancing corrosion resistance, which may facilitate the twenty-first mask layer 51 to fill up the groove of the first dielectric layer 40 and facilitate to maintain the flatness of the twenty-first mask layer 51. Further, the twenty-first mask layer 51 can also protect the first dielectric layer 40.

In this embodiment, the forming a twenty-second mask layer 52 on the initial twenty-first mask layer 51 in the array region 12 may include: forming an initial twenty-second mask layer 52 on the initial twenty-first mask layer 51 of the array region 12, and removing the initial twenty-second mask layer 52 in the peripheral region 11 to form the twenty-second mask layer 52.

In a concrete implementation manner, a material of the twenty-second mask layer 52 may include a photoresist. A formation process of the twenty-second mask layer 52 is briefly described as below by taking an example where the material of the twenty-second mask layer 52 is a positive photoresist. The positive photoresist is coated on the initial twenty-first mask layer 51 to form the initial twenty-second mask layer 52, then a photomask is formed on the initial twenty-second mask layer 52, such that the photomask can shield the positive photoresist whose projection is in the array region 12, and then exposure and development are performed on rest of the exposed positive photoresist to remove the initial twenty-second mask layer 52 whose projection is in the peripheral region 11. In this way, the twenty-second mask layer 52 is formed.

In this embodiment, after the first dielectric layer 40 is formed on the first mask layer 20 and the first mask pattern 30, the method also includes:

Step S106: forming a second mask pattern on the peripheral region; and forming a first device structure pattern on the first mask layer by using the second mask pattern as a mask.

In this embodiment, the forming a second mask pattern 41 on the peripheral region 11 includes: removing the first mask pattern 30 and a part of the first dielectric layer 40 on the peripheral region 11, and retaining the first dielectric layer 40 positioned on a sidewall of the first mask pattern 30 to form a second mask pattern 41.

Figure 7:
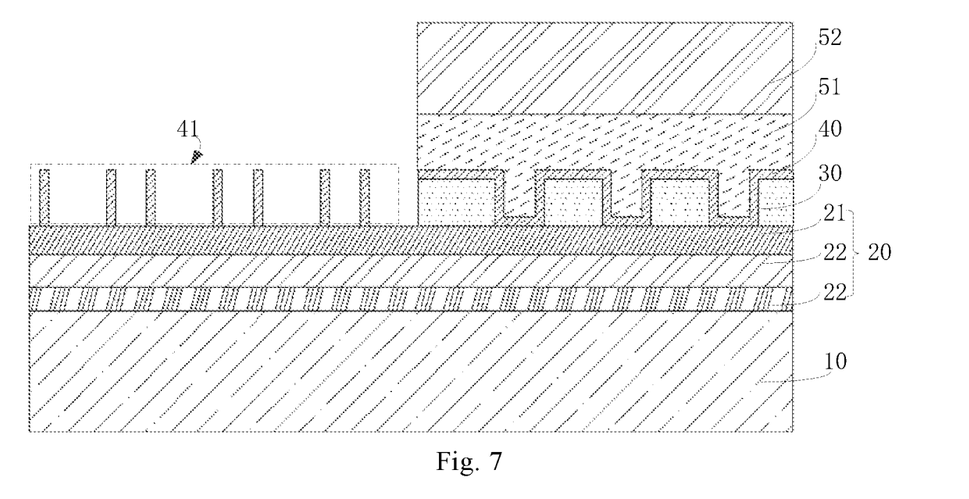
FIG. 7 is a schematic structural diagram showing a second mask pattern formed in the method for fabricating a semiconductor structure according to an embodiment of the present disclosure.

As shown in FIG. 6 and FIG. 7, in this embodiment, the first dielectric layer 40 covering the top surface of the first mask pattern 30 may be removed first to expose the first mask pattern 30. Next, the first mask pattern 30 and the first dielectric layer 40 covering the first mask layer 20 are removed, and the first dielectric layer 40 covering the sidewalls of the first mask pattern 30 is retained to form the second mask pattern 41.

With continued reference to FIG. 7, the second mask pattern 41 may include a plurality of rectangular blocks arranged at intervals. Of course, in some other examples, a shape of the second mask pattern 41 may be adjusted by setting a shape of the first mask pattern 30 and a film-forming thickness of the first dielectric layer 40, where the shape of the second mask pattern 41 is not particularly limited in this embodiment.

In this embodiment, after the second mask pattern 41 is formed on the peripheral region 11, the method also includes: forming a first device structure pattern 211 on the first mask layer 20 by using the second mask pattern 41 as a mask.

Figure 8:
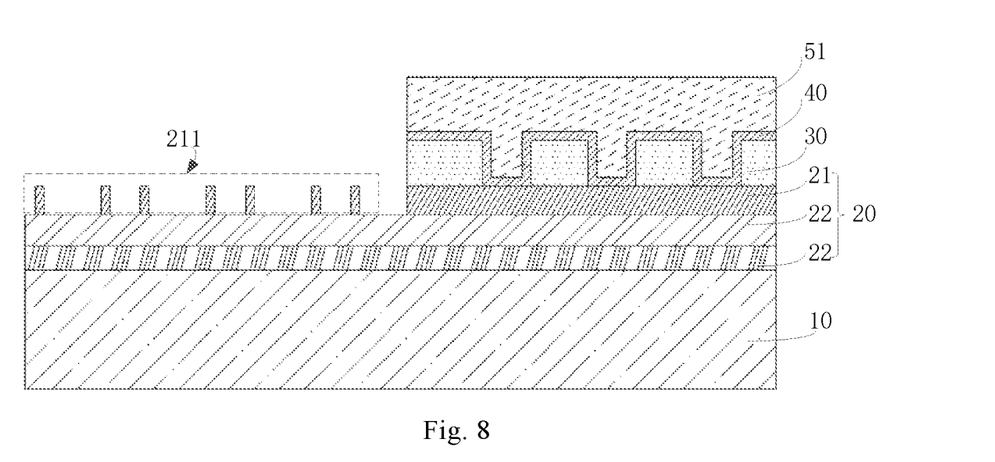
FIG. 8 is a schematic structural diagram showing a first device structure pattern formed in the method for fabricating a semiconductor structure according to an embodiment of the present disclosure.

Referring to FIG. 7 and FIG. 8, to form the first device structure pattern 211, it is required to remove a part of the first mask layer 20 by using the second mask pattern 41 as the mask. In this embodiment, the No. 11 mask layer 21 on the peripheral region 11 is etched by using the second mask pattern 41 as the mask to form the first device structure pattern 211. As shown in FIG. 8, a shape of the first device structure pattern 211 is the same as that of the second mask pattern 41, and the first device structure pattern 211 may include a plurality of rectangular blocks arranged at intervals. In some other examples, the shape of the first device structure pattern 211 may be adjusted by setting the shape of the second mask pattern 41, and the shape of the first device structure pattern 211 is not particularly limited in this embodiment.

In this embodiment, after the forming a second mask pattern 41 on the peripheral region 11 and forming a first device structure pattern 211 on the first mask layer 20 by using the second mask pattern 41 as a mask, the method also includes:

Step S107: forming a third mask layer on the first device structure pattern.

Figure 9:
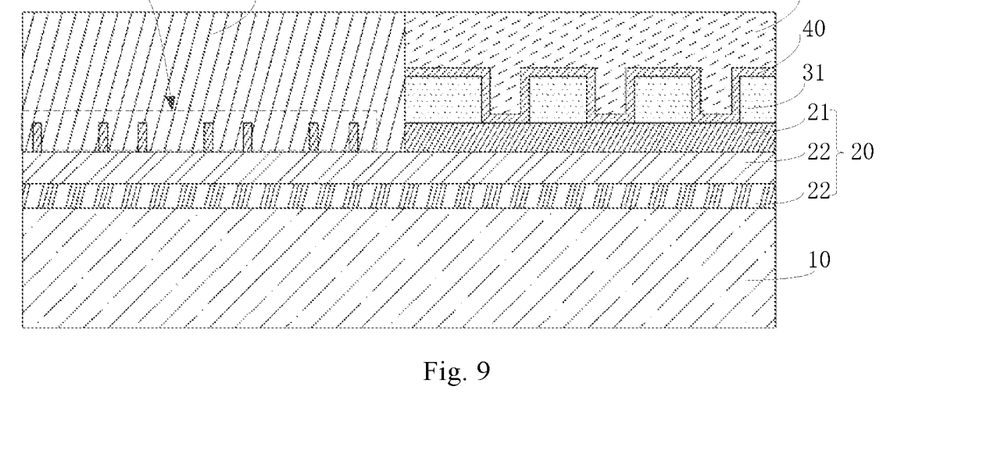
FIG. 9 is a schematic structural diagram showing a third mask layer formed in the method for fabricating a semiconductor structure according to an embodiment of the present disclosure.

As shown in FIG. 9, in the first mask layer 20, in the embodiment where the first device structure pattern 211 is shaped like a plurality of rectangular blocks arranged at intervals, the first device structure pattern 211 is formed in the eleventh layer 21, and the first device structure pattern 211 covers a part of the twelfth mask layer 22, such that a part of the twelfth mask layer 22 is exposed between adjacent two of the plurality of rectangular blocks. The third mask layer 60 conformally covers the No. 11 mask layer 21 and the exposed twelfth mask layer 22.

In this embodiment, the forming a third mask layer 60 on the first device structure pattern 211 may include: forming an initial third mask layer 60 on the first dielectric layer 40, and then removing the initial third mask layer 60 on the array region 12 to form the third mask layer 60.

In a concrete implementation manner, a material of the third mask layer 60 may include a photoresist. A formation process of the third mask layer 60 is briefly described as below by taking an example where the material of the third mask layer 60 is a positive photoresist. The positive photoresist is coated on the first device structure pattern 211 and the second mask layer to form the initial third mask layer 60, then a photomask is formed on the initial third mask layer 60, such that the photomask can shield the positive photoresist whose projection is in the peripheral region 11, and then exposure and development are performed on rest of the exposed positive photoresist to remove the initial third mask layer 60 whose projection is in the array region 12. That is, the initial third mask layer 60 covered on the second mask layer is removed to form the third mask layer 60.

It should be noted that in an embodiment where the material of the third mask layer 60 and the material of the twenty-second mask layer 52 are both positive photoresist or negative photoresist, a photomask is formed on the initial third mask layer 60, such that the photomask can shield the photoresist whose projection is in the peripheral region 11, and then exposure and development are performed on rest of the exposed photoresist to remove the initial third mask layer 60 whose projection is in the array region 12, such that the twenty-second mask layer 52 is exposed. At this moment, the twenty-second mask layer 52 covering the array region 12 may be further removed by means of exposure and development to expose the twenty-first mask layer 51, which may facilitate to form a third mask pattern 31 on the array region 12 subsequently.

In this embodiment, after the third mask layer 60 is formed on the first dielectric layer 40 in the peripheral region 11, the method also includes:

Step S108: forming a third mask pattern on the array region; and forming a second device structure pattern on the first mask layer by using the third mask pattern as a mask.

In this embodiment, the forming the third mask pattern 31 on the array region 12 includes: removing a part of the second mask layer and a part of the first dielectric layer 40 from the array region 12 to form the third mask pattern 31.

Figure 10:
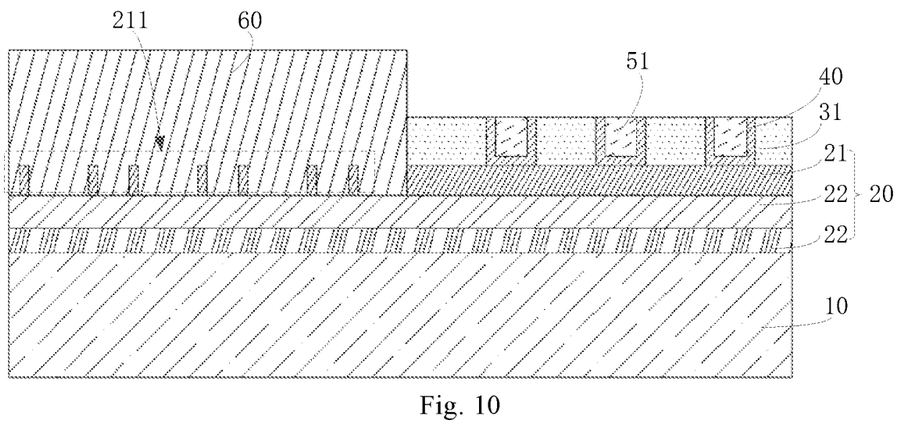
FIG. 10 is a schematic structural diagram obtained after a part of the twenty-second mask layer is removed in the method for fabricating a semiconductor structure according to an embodiment of the present disclosure.
Figure 11:
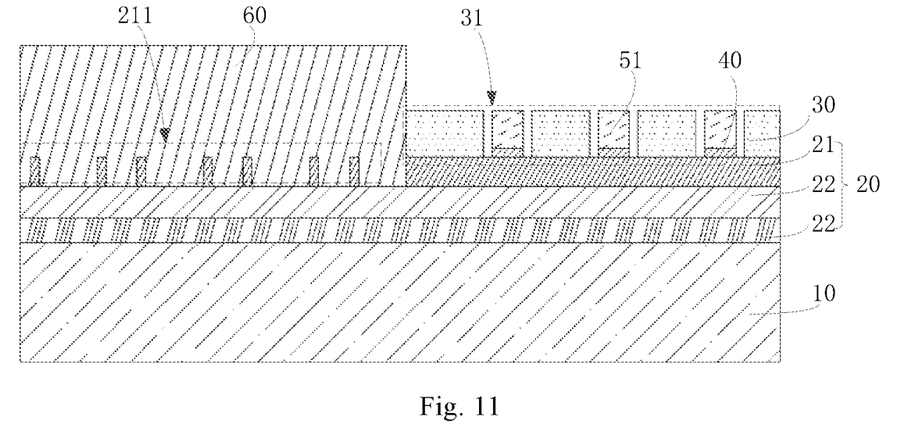
FIG. 11 is a schematic structural diagram showing a second mask pattern formed in the method for fabricating a semiconductor structure according to an embodiment of the present disclosure.

It is worth noting that as shown in FIG. 10 and FIG. 11, the twenty-second mask layer 52 and a part of the twenty-first mask layer 51 may be removed first, such that the first dielectric layer 40 covering the top surface of the first mask pattern 30 may be exposed, then the first dielectric layer 40 covering the top surface of the first mask pattern 30 is removed, and a part of the twenty-first mask layer 51 is removed synchronously, such that an end surface of the twenty-first mask layer 51 facing away from the substrate 10 is flush with the top surface of the first mask pattern 30. Next, the first dielectric layer 40 covering the sidewall of the first mask pattern 30 is removed, to retain the first mask pattern 30, a part of the first dielectric layer 40 and a part of the twenty-first mask layer 51 in the array region 12. In this way, the third mask pattern 31 is formed.

With continued reference to FIG. 11, the third mask pattern 31 may include a plurality of rectangular blocks arranged at intervals. Of course, in some other examples, a shape of the third mask pattern 31 may be adjusted by setting the shape of the first mask pattern 30 and a film-forming thickness of the first dielectric layer 40, where the shape of the third mask pattern 31 is not particularly limited in this embodiment.

In this embodiment, after the third mask pattern 31 is formed on the array region 12, the method also includes: forming the second device structure pattern 212 on the first mask layer 20 by using the third mask pattern 31 as a mask.

Figure 12:
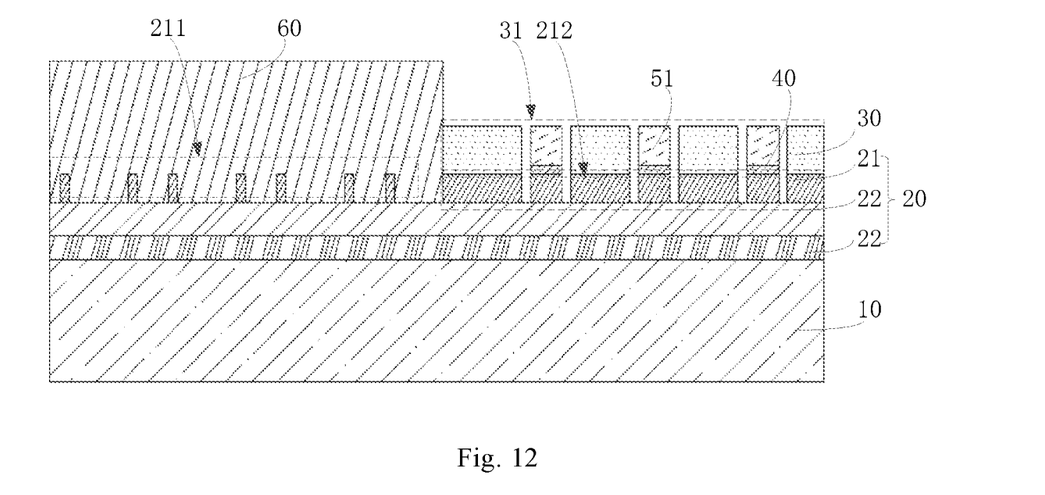
FIG. 12 is a schematic structural diagram showing a second device structure pattern formed in the method for fabricating a semiconductor structure according to an embodiment of the present disclosure.
Figure 13:
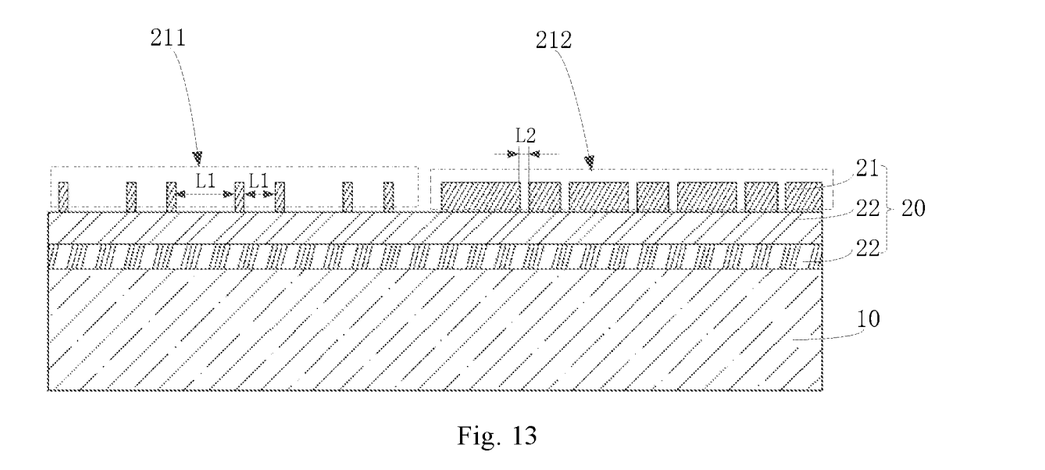
FIG. 13 is a schematic structural diagram showing the first device structure pattern and the second device structure pattern formed in the method for fabricating a semiconductor structure according to an embodiment of the present disclosure.

Referring to FIG. 12, to form the second device structure pattern 212, it is required to remove a part of the first mask layer 20 by using the third mask pattern 31 as a mask. In this embodiment, the No. 11 mask layer 21 on the array region 12 is etched by using the third mask pattern 31 as a mask to form the first device structure pattern 211. As shown in FIG. 13, the shape of the second device structure pattern 212 is the same as that of the third mask pattern 31, and the second device structure pattern 212 may include a plurality of rectangular blocks arranged at intervals. In some other examples, the shape of the second device structure pattern 212 may be adjusted by setting the shape of the third mask pattern 31, and the shape of the second device structure pattern 212 is not particularly limited in this embodiment.

In this embodiment, after the forming a third mask pattern 31 on the array region 12 and forming a second device structure pattern 212 on the first mask layer 20 by using the third mask pattern 31 as a mask, the method also includes:

Step S109: etching the substrate by using the first device structure pattern and the second device structure pattern as mask layer to form the peripheral region structure and the array region structure, respectively.

In this embodiment, referring to FIG. 12 and FIG. 13, after the second device structure pattern 212 is formed, and before the substrate 10 is etched by using the first device structure pattern 211 as a mask, the method also includes: removing the third mask layer 60 to expose the first device structure pattern 211 in the peripheral region 11 and a part of the substrate 10, to facilitate subsequent etching of the substrate 10 by using the first device structure pattern 211 as a mask.

Further, before etching the substrate 10 by using the second device structure pattern 212 as a mask, the method also includes: removing the first mask pattern 30, the first dielectric layer 40 and the twenty-first mask layer 51 in the array region 12, to expose the second device structure pattern 212 in the array region 12 and a part of the substrate 10, which may facilitate subsequent etching of the substrate 10 by using the second device structure pattern 212 as a mask.

Figure 14:
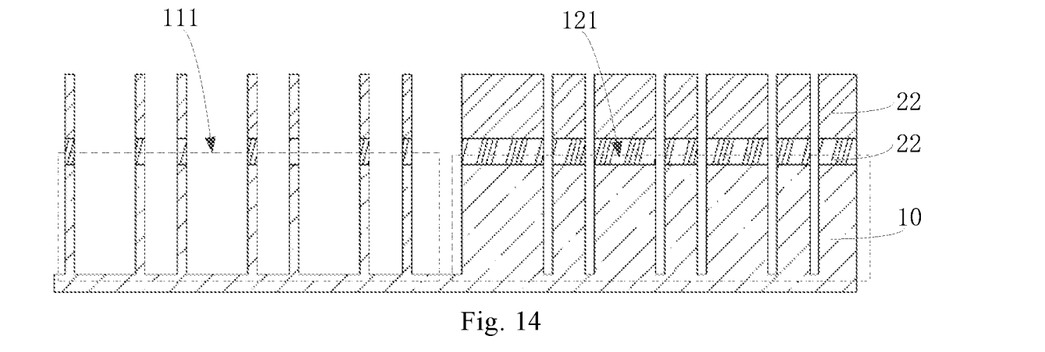
FIG. 14 is a schematic structural diagram obtained after a part of the first mask layer is removed in the method for fabricating a semiconductor structure according to an embodiment of the present disclosure.
Figure 15:
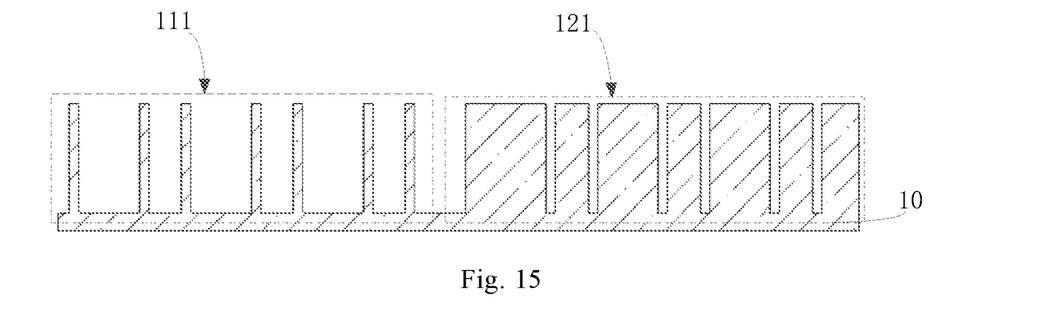
FIG. 15 is a schematic structural diagram showing a peripheral region structure and an array region structure formed in the method for fabricating a semiconductor structure according to an embodiment of the present disclosure.

In this embodiment, referring to FIG. 14 and FIG. 15, before etching the substrate 10 by using the first device structure pattern 211 and the second device structure pattern 212 as mask layer, the method also includes: etching the twelfth mask layer 22 by using the first device structure pattern 211 and the second device structure pattern 212 as mask layer, to avoid a subsequent etching effect on the substrate 10.

In some embodiments, a pattern density of the first device structure pattern 211 may be smaller than that of the second device structure pattern 212. As shown in FIG. 15, in the first device structure pattern 211, there is a first distance L1 between adjacent two of the plurality of rectangular blocks. It is worth noting that the first device structure pattern 211 in FIG. 15 is only exemplary. According to actual needs, the first distance L1 between any adjacent two of the plurality of rectangular blocks may be the same (that is, the plurality of rectangular blocks are arranged at equal distance) or may be different (that is, the plurality of rectangular blocks are arranged at unequal intervals). In the second device structure pattern 212, there is a second distance L2 between adjacent two of the plurality of rectangular blocks, and any first distance L1 is greater than the second distance L2. That is, the pattern density of the first device structure pattern 211 is smaller than that of the second device structure pattern 212. By arranging the first device structure pattern 211 and the second device structure pattern 212, it is advantageous to subsequently forming the corresponding peripheral region structure 111 and the array region structure 121 in the substrate 10, and ensuring that the pattern density of the peripheral region structure 111 is smaller than that of the array region structure 121, and thus it is advantageous to forming corresponding device layers on the peripheral region structure 111 and the array region structure 121 subsequently.

In this embodiment, after the substrate 10 is etched by using the first device structure pattern 211 and the second device structure pattern 212 as mask layer to form the peripheral region structure 111 and the array region structure 121 respectively, the method also includes: forming a first storage structure and a second storage structure on the array region structure 121 to adapt to different usage requirements in the array region 12. In this embodiment, the first storage structure and the second storage structure may include different types of memory cells. The first storage structure may include, for example, a plurality of dynamic random access memory cells, and each of the plurality of dynamic random access memory cells includes a transistor structure and a capacitor structure. The second storage structure may include, for example, a plurality of magnetic random access memory cells, and each of the plurality of magnetic random access memory cells includes a transistor structure and a magnetoresistive tunnel junction interposed between two metal lines. A resistance value of the magnetoresistive tunnel junction is changed by controlling transistors in the transistor structure, to read/write data. Of course, in some other examples, the first storage structure and the second storage structure may also include memory cells using other storage principles.

An embodiment of the present disclosure also provides a method for fabricating a semiconductor structure. The method includes: providing a substrate 10 including an array region 12 and a peripheral region 11; forming a first mask layer 20 covering the array region 12 and the peripheral region 11 on the substrate 10; forming a first mask pattern 30 on the first mask layer 20; forming a first dielectric layer 40 on the first mask layer 20 and the first mask pattern 30; forming a second mask layer on the first dielectric layer 40 of the array region 12; forming a second mask pattern 41 on the peripheral region 11; forming a first device structure pattern 211 on the first mask layer 20 by using the second mask pattern 41 as a mask; forming a third mask layer 60 on the first dielectric layer 40 of the peripheral region 11; forming a third mask pattern 31 on the array region 12; forming a second device structure pattern 212 on the first mask layer 20 by using the third mask pattern 31 as a mask; and etching the substrate 10 by using the first device structure pattern 211 and the second device structure pattern 212 as mask layer to form a peripheral region structure 111 and an array region structure 121, respectively. According to the method for fabricating a semiconductor structure provided by the embodiment of the present disclosure, the first device structure pattern 211 is first formed on the first mask layer 20, then the second device structure pattern 212 is formed on the first mask layer 20, and then the substrate 10 is etched by using the first device structure pattern 211 and the second device structure pattern 212 as mask layer to form the peripheral region structure 111 and the array region structure 121 synchronously on the substrate 10. In this way, technological processes are simplified, device collapse is prevented, fabrication difficulties are reduced, and production efficiency is improved.

An embodiment of the present disclosure also provides a semiconductor structure including a substrate 10, which includes an array region 12 and a peripheral region 11, where the peripheral region 11 has a peripheral region structure 111, and the array region 12 has an array region structure 121. A method for fabricating the peripheral region structure 111 and the array region structure 121 includes: forming a first mask layer 20 covering the array region 12 and the peripheral region 11 on the substrate 10; forming a first mask pattern 30 on the first mask layer 20; forming a first dielectric layer 40 on the first mask layer 20 and the first mask pattern 30, and forming a second mask layer on the first dielectric layer 40 of the array region 12; forming a second mask pattern 41 on the peripheral region 11; forming a first device structure pattern 211 on the first mask layer 20 by using the second mask pattern 41 as a mask; forming a third mask layer 60 on the first dielectric layer 40 of the peripheral region 11; forming a third mask pattern 31 on the array region 12; forming a second device structure pattern 212 on the first mask layer 20 by using the third mask pattern 31 as a mask; and etching the substrate 10 by using the first device structure pattern 211 and the second device structure pattern 212 as mask layer to form the peripheral region structure 111 and the array region structure 121, respectively. Through this fabrication method, the first device structure pattern 211 is first formed on the first mask layer 20, then the second device structure pattern 212 is formed on the first mask layer 20, and then the substrate 10 is etched by using the first device structure pattern 211 and the second device structure pattern 212 as mask layer, to synchronously form the peripheral region structure 111 and the array region structure 121 on the substrate 10. In this way, the technological processes are simplified, device collapse is prevented, the fabrication difficulties are reduced, and the production efficiency is improved.

Those skilled in the art may clearly understand that for the convenience and brevity of description, division of the above functional modules is merely taken as an example for illustration. In actual applications, the foregoing functions may be allocated to different functional modules and implemented according to needs. That is, an internal structure of an apparatus is divided into different functional modules to implement all or a part of the functions described above. For a detailed working process of the apparatus described above, reference may be made to the corresponding process in the foregoing method embodiments, and details are not described herein again.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
   providing a substrate comprising an array region and a peripheral region;
   forming a first mask layer covering the array region and the peripheral region on the substrate;
   forming a first mask pattern on the first mask layer;
   forming a first dielectric layer on the first mask layer and the first mask pattern;
   forming a second mask layer on the first dielectric layer of the array region;
   forming a second mask pattern on the peripheral region; and forming a first device structure pattern on the first mask layer by using the second mask pattern as a mask;
   forming a third mask layer on the first device structure pattern;
   forming a third mask pattern on the array region, wherein the first device structure pattern is covered by the third mask layer; and forming a second device structure pattern on the first mask layer by using the third mask pattern as a mask; and
   etching the substrate by using the first device structure pattern and the second device structure pattern as mask layer to form a peripheral region structure and an array region structure, respectively.

2. The method for fabricating a semiconductor structure according to claim 1, wherein the first mask layer comprises an eleventh mask layer;
   the eleventh mask layer on the peripheral region is etched by using the second mask pattern as the mask to form the first device structure pattern; and
   the eleventh mask layer on the array region is etched by using the third mask pattern as the mask to form the second device structure pattern.

3. The method for fabricating a semiconductor structure according to claim 1, wherein the forming a third mask pattern on the array region comprises:
   removing a part of the second mask layer and the first dielectric layer positioned on a sidewall of the first mask pattern on the array region to form the third mask pattern.

4. The method for fabricating a semiconductor structure according to claim 3, wherein the second mask layer comprises a twenty-first mask layer and a twenty-second mask layer, the twenty-first mask layer covering a top surface and a sidewall of the first dielectric layer, and the twenty-second mask layer being positioned above the twenty-first mask layer.

5. The method for fabricating a semiconductor structure according to claim 4, wherein the twenty-second mask layer on the array region, the twenty-first mask layer on a top of the first mask pattern and the first dielectric are removed; and
   the first dielectric layer positioned on the sidewall of the first mask pattern on the array region is removed to form the third mask pattern.

6. The method for fabricating a semiconductor structure according to claim 3, wherein after forming a first mask pattern on the first mask layer, the method further comprises:
   forming an initial twenty-first mask layer on the first mask pattern, forming a twenty-second mask layer on the initial twenty-first mask layer of the array region, and removing the initial twenty-first mask layer on the peripheral region to form the twenty-first mask layer.

7. The method for fabricating a semiconductor structure according to claim 1, wherein the forming a second mask pattern on the peripheral region comprises:
   removing the first mask pattern and a part of the first dielectric layer on the peripheral region, and retaining the first dielectric layer positioned on a sidewall of the first mask pattern to form a second mask pattern.

8. The method for fabricating a semiconductor structure according to claim 1, wherein a pattern density of the first device structure pattern is smaller than a pattern density of the second device structure pattern.

9. The method for fabricating a semiconductor structure according to claim 8, wherein a pattern density of the first mask pattern on the array region is the same as a pattern density of the first mask pattern on the peripheral region.

10. The method for fabricating a semiconductor structure according to claim 1, wherein the first mask pattern comprises an elongated pattern.

11. The method for fabricating a semiconductor structure according to claim 1, wherein the forming a first dielectric layer on the first mask layer and the first mask pattern comprises:
    covering a part of surface of the first mask layer by the first mask pattern; and
    conformally covering, by the first dielectric layer, a top surface and a sidewall of the first mask pattern and an exposed surface of the first mask layer.

12. The method for fabricating a semiconductor structure according to claim 2, wherein the first mask layer comprises a twelfth mask layer positioned between the eleventh mask layer and the substrate; and
    before etching the substrate by using the first device structure pattern and the second device structure pattern as mask layer, the twelfth mask layer is etched by using the first device structure pattern and the second device structure pattern as the masks.

13. The method for fabricating a semiconductor structure according to claim 1, wherein the third mask layer is removed after forming the second device structure pattern.

14. The method for fabricating a semiconductor structure according to claim 1, wherein the first mask layer comprises any combination of one or more of silicon oxide, dielectric anti-reflective coating, silicon oxynitride, amorphous carbon, and silicon nitride.

15. A semiconductor structure formed by means of a method for fabricating the semiconductor structure, the method comprises:
  providing a substrate comprising an array region and a peripheral region;
  forming a first mask layer covering the array region and the peripheral region on the substrate;
  forming a first mask pattern on the first mask layer;
  forming a first dielectric layer on the first mask layer and the first mask pattern;
  forming a second mask layer on the first dielectric layer of the array region;
  forming a second mask pattern on the peripheral region; and forming a first device structure pattern on the first mask layer by using the second mask pattern as a mask;
  forming a third mask layer on the first device structure pattern;
  forming a third mask pattern on the array region, wherein the first device structure pattern is covered by the third mask layer; and forming a second device structure pattern on the first mask layer by using the third mask pattern as a mask; and
  etching the substrate by using the first device structure pattern and the second device structure pattern as mask layer to form a peripheral region structure and an array region structure, respectively.

* * * * *